US009476959B2

(12) United States Patent
Dannels

(10) Patent No.: US 9,476,959 B2
(45) Date of Patent: Oct. 25, 2016

(54) MRI GHOSTING CORRECTION USING UNEQUAL MAGNITUDES RATIO

(71) Applicant: TOSHIBA MEDICAL SYSTEMS CORPORATION, Otawara-Shi, Tochigi (JP)

(72) Inventor: Wayne R. Dannels, Mentor, OH (US)

(73) Assignee: TOSHIBA MEDICAL SYSTEMS CORPORATION, Otawara-Shi, Tochigi-Ken (JP)

(\*) Notice: Subject to any disclaimer, the term of this patent is extended or adjusted under 35 U.S.C. 154(b) by 613 days.

(21) Appl. No.: 14/017,894

(22) Filed: Sep. 4, 2013

(65) Prior Publication Data

US 2015/0061668 A1    Mar. 5, 2015

(51) Int. Cl.
*G01R 33/56* (2006.01)
*G01R 33/565* (2006.01)

(52) U.S. Cl.
CPC ............................ *G01R 33/56554* (2013.01)

(58) Field of Classification Search
CPC .............................................. G01R 33/56554
See application file for complete search history.

(56) References Cited

U.S. PATENT DOCUMENTS

| 4,993,075 | A |   | 2/1991  | Sekihara et al. |              |
|-----------|---|---|---------|-----------------|--------------|
| 5,068,609 | A | * | 11/1991 | Bruder          | G01R 33/56554 |
|           |   |   |         |                 | 324/309      |
| 5,089,778 | A | * | 2/1992  | Zakhor          | G01R 33/565  |
|           |   |   |         |                 | 324/312      |
| 6,697,507 | B1| * | 2/2004  | Chapman         | G01R 33/565  |
|           |   |   |         |                 | 382/107      |
| 7,098,662 | B2|   | 8/2006  | Hinks et al.    |              |
| 2006/0066308 | A1 | * | 3/2006 | Hinks         | G01R 33/56554 |
|           |   |   |         |                 | 324/309      |

OTHER PUBLICATIONS

Poser et al. Single-Shot Echo-Planar Imaging With Nyquist Ghost Compensation: Interleaved Dual Echo With Acceleration (IDEA) Echo-Planar Imaging (EPI), Mag.Res. in Med. 69:37-47.\*
Bruder, et al., "Image Reconstruction for Echo Planar Imaging with Nonequidistant k-Space Sampling," *MRM* 23:311-323 (1992).
Chen, et al., "Removal of EPI Nyquist Ghost Artifacts With Two-Dimensional Phase Correction," *MRM* 51:1247-1253 (2004).
Delakis, et al., "MRI Receiver Frequency Response as a Contributor to Nyquist Ghosting in Echo Planar Imaging," *JMRI* 22:324-328 (2005).
Xu, et al., "Robust 2D Phase Correction for Echo Planar Imaging Under a Tight Field-of-View," *MRM* 64:1800-1813 (2010).

\* cited by examiner

*Primary Examiner* — G. M. Hyder
(74) *Attorney, Agent, or Firm* — Nixon & Vanderhye P.C.

(57) ABSTRACT

A magnetic resonance imaging (MRI) system, method and/or computer readable medium is configured to effect MR imaging with reduced ghosting artifacts by operations including determining spatially varying signal magnitude differences associated with first and second parts of a reference MR data, and reconstructing a diagnostic image based upon a first and a second parts of main scan data and the determined spatially varying signal magnitude differences. The first parts of the reference data and main scan data is acquired using a first readout gradient, and the second parts of the reference data and main scan data is acquired using a second readout gradient that is different from the first readout gradient.

20 Claims, 5 Drawing Sheets

Even diagnostic image

Odd diagnostic image, uncorrected (in this example, too bright on right side)

Odd/and even diagnostic images standard reconstruction with ghosts

Even diagnostic image

Odd diagnostic image, with magnitude spatial correction

Combined even diagnostic image corrected odd diagnostic image, ghosts reduced

MRI GHOSTING CORRECTION USING UNEQUAL MAGNITUDES RATIO

FIELD

The subject matter below relates generally to magnetic resonance imaging (MRI) systems. In particular, the subject matter relates to reducing ghosting artifacts in diagnostic images.

DETAILED DESCRIPTION

Figure 1:
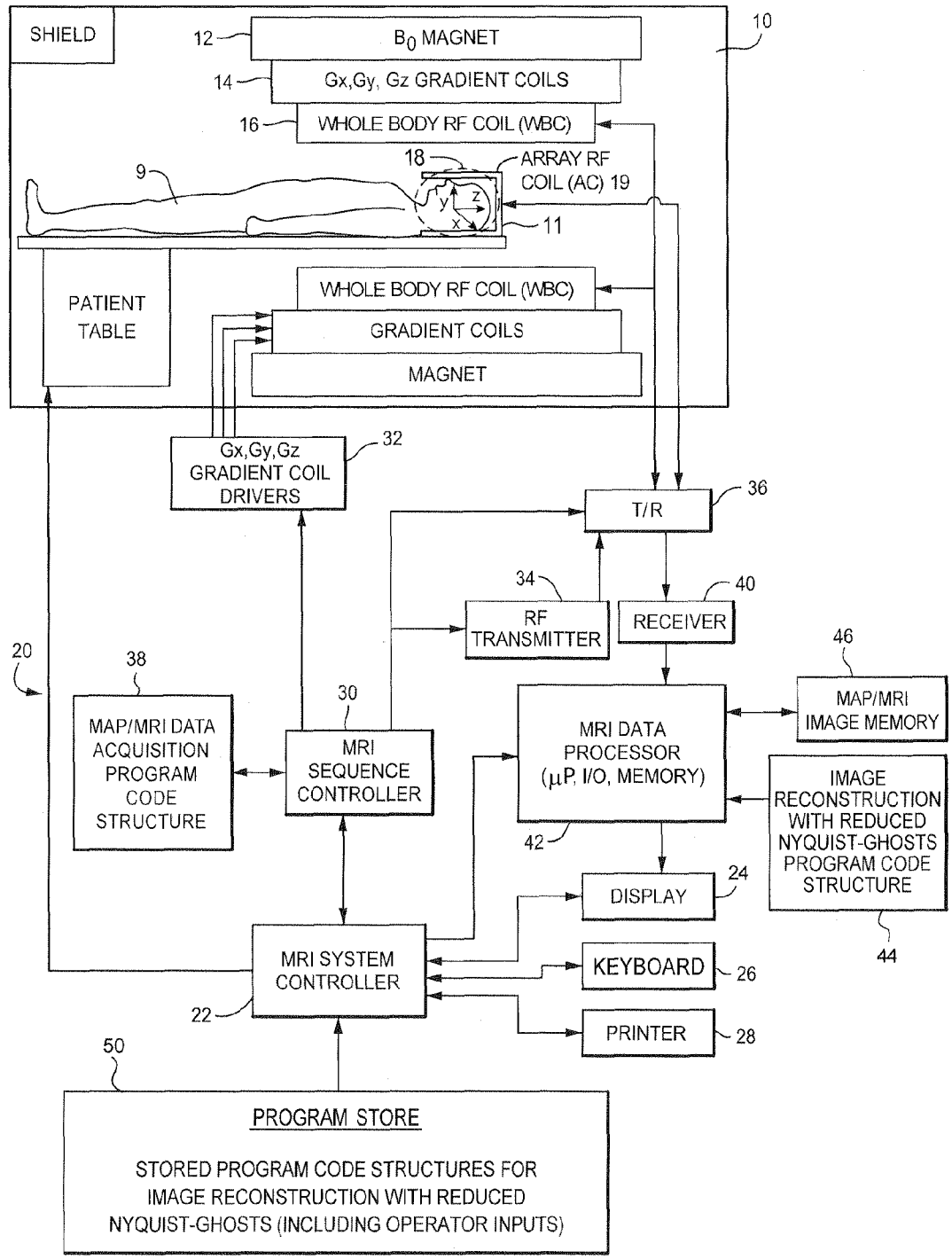
FIG. 1 is a high-level schematic block diagram of an MRI system adapted to reduce ghosting artifacts, in accordance with one or more embodiments.

The MRI system shown in FIG. 1 includes a gantry 10 (shown in schematic cross-section) and various related system components 20 interfaced therewith. At least the gantry 10 is typically located in a shielded room. The MRI system geometry depicted in FIG. 1 includes a substantially coaxial cylindrical arrangement of the static field BO magnet 12, a Gx, Gy and Gz gradient coil set 14 and a large whole body RF coil (WBC) assembly 16. Along the horizontal axis of this cylindrical array of elements is an imaging volume 18 shown as substantially encompassing the head of a patient 9 supported by a patient table 11. A smaller array RF coil (AC) 19 might be more closely coupled to the patient head (referred to herein, for example, as "scanned object" or "object") in imaging volume 18. As those in the art will appreciate, compared to the WBC (whole body coil), relatively small coils and/or arrays such as surface coils or the like are often customized for particular body parts (e.g., arms, shoulders, elbows, wrists, knees, legs, chest, spine, etc.). Such smaller RF coils are herein referred to as array coils (AC) or phased array coils. These may include at least one coil configured to transmit RF signals into the imaging volume and a plurality of receiver coils configured to receive RF signals from an object, such as the patient head in the example above, in the imaging volume.

An MRI system controller 22 has input/output ports connected to a display 24, keyboard 26 and printer 28. As will be appreciated, the display 24 may be of the touch-screen variety so that it provides control inputs as well.

The MRI system controller 22 interfaces with MRI sequence controller 30 which, in turn, controls the Gx, Gy and Gz gradient coil drivers 32, as well as the RF transmitter 34 and the transmit/receive switch 36 (if the same RF coil is used for both transmission and reception). The MRI sequence controller 30 includes suitable program code structure 38 for implementing MRI imaging (also known as nuclear magnetic resonance, or NMR, imaging) techniques including parallel imaging. For some imaging techniques such as parallel imaging, MRI sequence controller 30 may facilitate a preparation scan (prescan) sequence which is used to determine sensitivity maps for RF coils 16 and/or 19, and a scan sequence to obtain a diagnostic image.

The MRI system 20 includes an RF receiver 40 providing input to data processor 42 so as to create processed image data, which is sent to display 24. The MRI data processor 42 is also configured for access to coil calibration data or other reference data such as that acquired by prescanning and/or system configuration parameters 46 and MRI image reconstruction program code structures 44 and 50.

Also illustrated in FIG. 1 is a generalized depiction of an MRI system program store 50 where stored program code structures (e.g., for image reconstruction with reduced ghosting artifacts, for defining graphical user interfaces and accepting operator inputs to same, etc.) are stored in non-transitory computer-readable storage media accessible to the various data processing components of the MRI system. As those in the art will appreciate, the program store 50 may be segmented and directly connected, at least in part, to different ones of the system 20 processing computers having most immediate need for such stored program code structures in their normal operation (i.e., rather than being commonly stored and connected directly to the MRI system controller 22).

Indeed, as those in the art will appreciate, the FIG. 1 depiction is a very high-level simplified diagram of a typical MRI system with some modifications so as to practice exemplary embodiments described hereinbelow. The system components can be divided into different logical collections of "boxes" and typically comprise numerous digital signal processors (DSP), microprocessors and special purpose processing circuits (e.g., for fast A/D conversions, fast Fourier transforming, array processing, etc.). Each of those processors is typically a clocked "state machine" wherein the physical data processing circuits progress from one physical state to another upon the occurrence of each clock cycle (or predetermined number of clock cycles).

Not only does the physical state of processing circuits (e.g., CPUs, registers, buffers, arithmetic units, etc.) progressively change from one clock cycle to another during the course of operation, the physical state of associated data storage media (e.g., bit storage sites in magnetic storage media) is transformed from one state to another during operation of such a system. For example, at the conclusion of an image reconstruction process and/or sometimes a correction map generation process, an array of computer-readable accessible data value storage sites in physical storage media will be transformed from some prior state (e.g., all uniform "zero" values or all "one" values) to a new state wherein the physical states at the physical sites of such an array vary between minimum and maximum values to represent real world physical events and conditions (e.g., the internal physical structures of a patient over an imaging volume space, or a system sensitivity difference between portions of a data acquisition procedure). As those in the art will appreciate, such arrays of stored data values represent and also constitute a physical structure—as does a particular structure of computer control program codes that, when sequentially loaded into instruction registers and executed by one or more CPUs of the MRI system 20, causes a particular sequence of operational states to occur and be transitioned through within the MRI system.

The exemplary embodiments described below provide improved ways to generate and display MR images. The embodiments provide for eliminating or substantially reducing ghosting artifacts that occur in imaging techniques such as, for example, echo planar imaging (EPI).

MRI images are formed by acquiring RF response values (e.g., nuclear magnetic resonance (NMR) echo data) for points in k-space. The RF response values are generated by traversing k-space in two or three dimensions (2D or 3D) according to a configured MRI data acquisition pulse sequence. The acquisition of echo data in the frequency-encoding $G_{ro}$ direction (e.g., along the x-axis) is typically rapid and on the order of several milliseconds. However, along the phase-encoding $G_{pe}$ axis (e.g., y-axis), a different value of the applied phase-encoding gradient $G_{pe}$ is used to sample each point. Therefore, typically, the acquisition time for an MRI image is largely determined by the number of phase-encoding steps.

EPI is a technique for rapid imaging. EPI applications benefit from being able to take a complete 2D image in a single shot (i.e., one TR interval). After a single excitation, a selected rapid gradient sequence encodes the magnetization repeatedly in order to fill at least half or the entire k-space. Acquiring a complete image in a single shot is highly desired for applications such as, for example, diffusion (e.g., diffusion weighted imaging—DWI), functional MRI (FMRI), and perfusion (dynamic susceptibility contrast (DSC) enhancement or arterial spin labeling (ASL)).

However, EPI requires that alternating lines of k-space are collected with alternating gradient readout polarity. Thus, when EPI is used 2D k-space data are acquired using one or a few shots, where each shot covers multiple k-space lines by a sequence of $G_{ro}$ readout gradients with alternating polarities.

In order to fill k-space correctly, every other line is time reversed before a Fourier transform is applied to convert the raw data to an image. Thus, the lines of raw data in k-space include two sets of alternating lines: a set of lines in k-space read in a first direction (e.g., left-right direction) and a set of lines in the second direction (e.g., right-left direction). In this discussion, the set of lines that includes a line traversing the point of origin in k-space is referred to as the set of "even" lines, and the other set as set of "odd" lines. Typically, different imperfect signal modulations or error terms appear on the even lines, compared to the odd lines. This causes a well known ghost artifact, the "N/2 ghost" or "Nyquist ghost". The Nyquist ghost, a ghost artifact shifted by half the field of view (FOV) in the phase encoding direction of the image, is caused by the even-odd modulation difference varying along the $G_{pe}$ phase encoding direction (e.g., an alternating modulation along the $k_y$ axis in k-space). When this ghost overlaps with the object being imaged, accurate diagnosis may be made difficult.

Several aspects associated with MR data acquisition can contribute to signal inconsistency. Currently, many corrective measures are used to reduce the Nyquist ghost. But, although each corrective measure can reduce the ghost in varying degrees, none correct it fully. Multiple corrective measures are sometimes applied within a single MR acquisition and its reconstruction.

Because EPI applications routinely are used in cases where speed is important, or where multiple encodings are important (many DWI b-values, many FMRI time repetitions, many ASL physiological flow averaging shots, etc.), it is generally not appropriate to increase the number of repetitions to reduce the ghost. Thus, it is generally desirable to use EPI methods where each single excitation pulse (e.g., single TR) generates a single raw image (perhaps with a small number of prior calibration shots).

Because hardware and physiological and safety constraints limit the encoding rate, EPI scans generally have distortions in the phase encode direction. To keep these distortions smaller, readouts must generally be kept short.

These tradeoffs regarding efficient numbers of imaging shots and short readouts render many proposed correction mechanisms impractical for human clinical applications. Effective correction of ghosts, without making compromises of single TR, and without sacrificing fast alternating readout, and without sacrificing the efficiencies to be gained through parallel imaging are extremely important.

With some conventional EPI reconstruction ghost correction methods, ghosting artifact strength where the ghost is on the order 5% to 10% of the underlying correct image intensity even in favorable cases is common. With less favorable conditions, ghosting can increase substantially, at least locally, in images.

Some newer 2D reconstruction corrections which utilize phase corrections yield ghosting levels better than the majority of conventional techniques. These 2D corrections utilize a phase correction parameter that is spatially dependent in the imaging plane. Complex signal phasors are associated with the modulation between "even" and "odd" parts of the data. 2D correction maps or correction values provide for corrections that are spatially varying in the 2D slice, especially when they are not composed of very simple separable corrections in the readout and the phase encode directions. Chen, N K and Wyrwicz, A M. *Removal of EPI Nyquist ghost artifacts with two-dimensional phase correction*, Magnetic Resonance in Medicine. 2004; 51:1247-1253 ("Chen"), and Xu, D. et al., *Robust 2D Phase Correction for Echo-Planar Imaging Under a Tight Field of View*, Magn. Reson. Med., 2010 December; 64(6):1800-13 ("Xu"), which are both hereby incorporated by reference in their entireties, provide two such techniques. Chen and Xu characterize the main difference between even and odd echoes as coming from a signal phase difference term, which is described with a spatially varying phase map.

Basic 2D phase corrections for the purpose of EPI ghost artifact reduction, as described above, routinely leave ghosting artifacts of about 2% even under favorable conditions. Embodiments disclosed herein provide for further reducing ghosting, including to levels below the 2% threshold, under a wide range of uncompromised scanning conditions.

In exemplary embodiments, in addition to phase corrections performed in many ghost correction techniques, the magnitude differences in odd and even images are specifically corrected. Correction of magnitude differences, for example, among other aspects, eliminates or reduces effects of frequency response non-flatness observed in many MRI systems, so that Nyquist ghost elimination is further enhanced.

Figure 2:
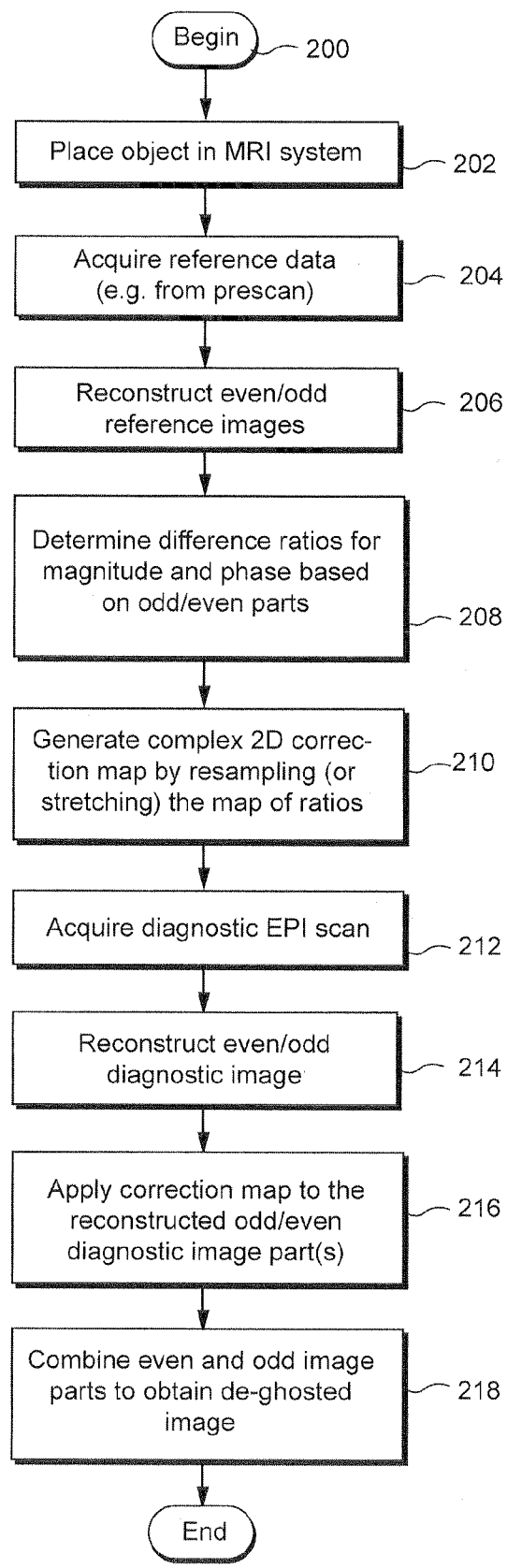
FIG. 2 illustrates a flow chart of a method for generating images with reduced ghosting artifacts, in accordance with one or more embodiments.

FIG. 2 illustrates a flow chart of a method for generating images with reduced ghosting artifacts due to alternating lines of k-space being collected with alternating gradient readout polarity signals, in accordance with one or more embodiments. In the illustrated embodiment, method 200 includes operations 202-218. In some embodiments, however, one or more of the operations 202-218 may not be performed, or may be performed in an order other than that shown.

At operation 202, the object to be scanned is placed in the MRI system. This operation includes, in addition to placing the object in the MRI gantry in a manner suitable for scanning, configuring the MRI system for executing scanning sequences appropriate for acquiring the desired type of diagnostic images. Configurations may include defining of prescan and main scan sequences, gradient configurations, parameters related to magnitude and phase corrections applied to images, and the like.

At operation 204, reference data is generated by performing a prescan of the object that is located in the MRI gantry. The reference data may also be referred to as calibration data because they may, in many embodiments, be used by the MRI system for various settings of any of several other algorithm corrections or hardware settings, or to help achieve equilibrium magnetization signal, etc. The prescan can be executed in a configurable time period, typically on the order of a few seconds and substantially shorter in duration than a main (diagnostic) scan. The prescan may yield one or more low resolution images for the entire imaging volume (in this case, with the object placed inside) in the scanner, or each of several 2D slice locations to be imaged in a subsequent multislice scan. In an embodiment, an EPI scan is performed as the prescan at a lower resolution than the EPI scan to be performed in the diagnostic scan.

In order to ensure that the prescan is performed under identical or almost identical conditions as the corresponding diagnostic scan, the pulse sequence for the prescan may be configured to be identical or nearly identical to the pulse sequence of the diagnostic scan.

For purposes of correction and calibration, it is usually desired that the calibration data is free from aliasing. Therefore, according to an embodiment, the size of the FOV of the prescan is set to at least twice the FOV size of the diagnostic image. Alternatively, the size of the gradient blip in k-space may be set to half the size of a corresponding blip configured for the diagnostic scan, or yet smaller in the case of diagnostic scans with parallel imaging acceleration. Note that an increase factor of the FOV in the image domain is mathematically equivalent to the reduction factor in k-space domain of the size of the corresponding gradient blip.

In some embodiments, the prescan is based upon a single shot. For example, all the reference data associated with the post processing of a particular diagnostic scan is obtained from one RF excitation.

In some other embodiments, the prescanning may be based upon more than one shot. Multiple prescan shots may be helpful in making the geometric distortion of the prescan shots the same as in the diagnostic scan. However, in the correction of magnitude differences, multiple prescan shots can cause extra complexity because, for example, magnitude differences can appear naturally in two separate EPI shots separated by TR which is often over a second long. Chen, for example, describes a prescan technique having multiple prescan shots.

At operation 206, an odd reference image and an even reference image are generated from the reference data. The odd reference image is derived from the odd lines in the reference data and the even reference image is derived from the even lines. In an example embodiment, the odd reference image is generated from the odd lines in the reference data by zero-filling data locations corresponding to the even lines. Similarly, the even reference image may be generated from the even lines by, for example, zero-filling the data locations corresponding odd lines. Thus, because the set of odd lines and the set of even lines do not overlap, the odd reference image and the even reference image are generated independently of each other.

The odd and even reference images may be generated by using a 2DFT (2D Fourier transform) on k-space data.

Figure 3A:
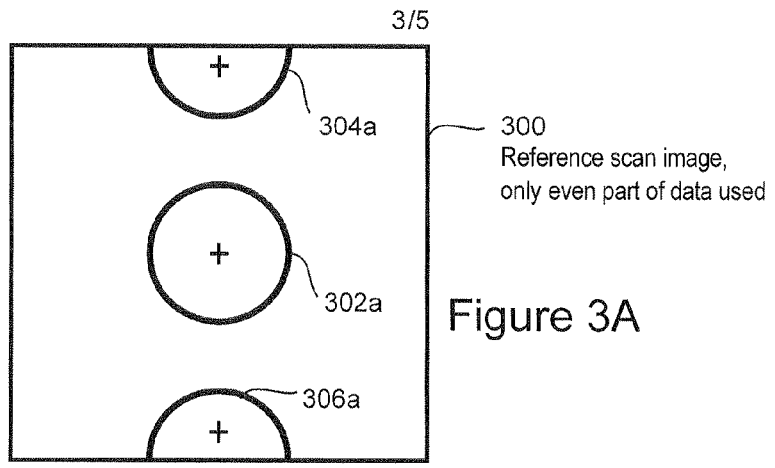
FIGS. 3A and 3B illustrate exemplary sketches of prescan images using echo planar imaging of an object, in accordance with one or more embodiments.
Figure 3B:
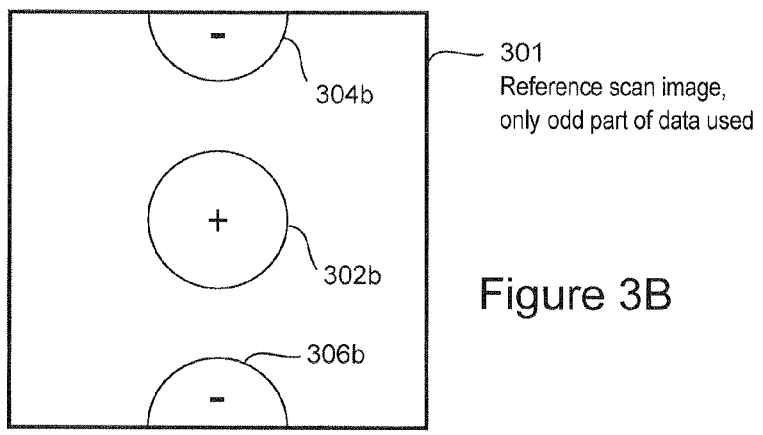
Figure 6:
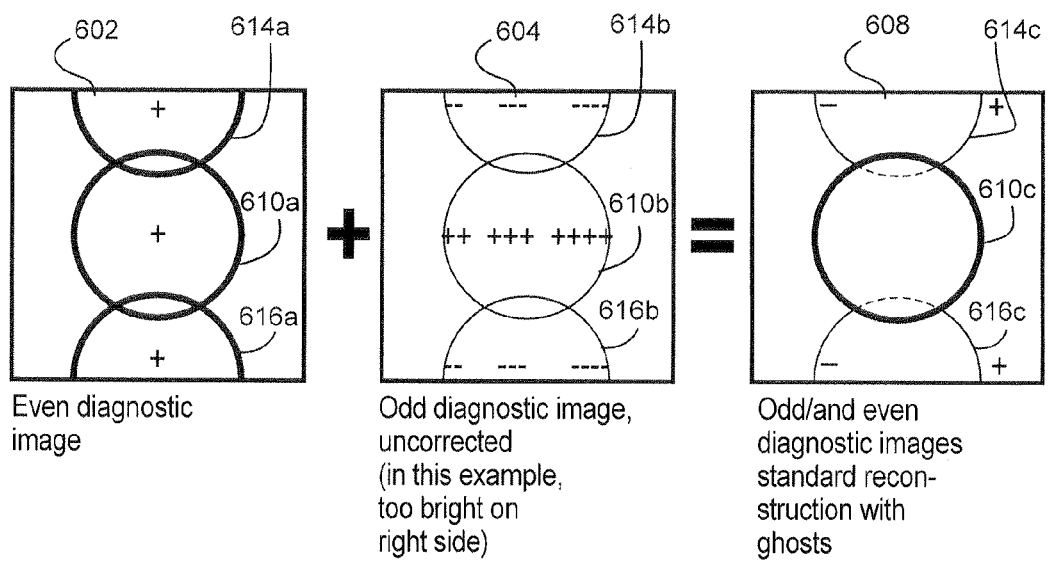
FIG. 6 illustrates example sketches of diagnostic images before reducing ghost artifacts.

FIGS. 3A and 3B are example sketches respectively of an even reference image 300 and an odd reference image 301 generated from a prescan of an object that has a circular shape shown as 302a and 302b. The circular shape of the object here is for purposes of example, and in practice it would generally be a 2D image, such as of a slice of brain. Items 304a-b and 306a-b are Nyquist ghosts of object 302a-b. The even reference image includes, as shown, a positive object and positive Nyquist ghosts, whereas the odd reference image includes a positive object and negative Nyquist ghosts. If there were no phase or magnitude differences, and if the even and odd reference images were combined, the positive and negative ghosts would cancel out to produce an image free of Nyquist ghost. However, the odd and even reference images include some magnitude and/or phase shift or error due to the alternating readout acquisition that prevents the positive and negative ghosts from completely cancelling out each other. As shown in FIGS. 3A and 3B, the prescan Nyquist ghosts 304a-306a and 304b-306b do not overlap the object. This is because the prescan images have a FOV that is at least double the FOV of the diagnostic image, and therefore the ghost artifacts, which in the diagnostic image would be shifted ½ FOV from the object being scanned, do not overlap the object in the prescan image. Contrasting FIG. 3A with diagnostic images of the same or similar object as shown in FIG. 6 image 602, illustrates the overlap of the object in the diagnostic image and the separation of the ghost artifact such that no overlap exists between them in larger FOV prescan images.

Returning to FIG. 2, at operation 208, magnitude differences and phase differences between the odd reference image and the even reference image are determined. The differences are determined in the image domain, rather than in k-space. For example, the differences may be determined based upon corresponding points (e.g., pixels) subsequent to applying the Fourier transform either in one direction (e.g., y direction in the xy plane) or in both x and y directions. For each pixel position in an odd or even reference image, a difference may be determined. Note that values for magnitude and/or phase exist at each pixel position where there is signal from the object (e.g., each pixel corresponding to a part of the object). The determined differences can be maintained in memory as a ratio of the corresponding odd and even reference image magnitudes, or as a difference between the corresponding odd and even reference image magnitudes.

Figure 4:
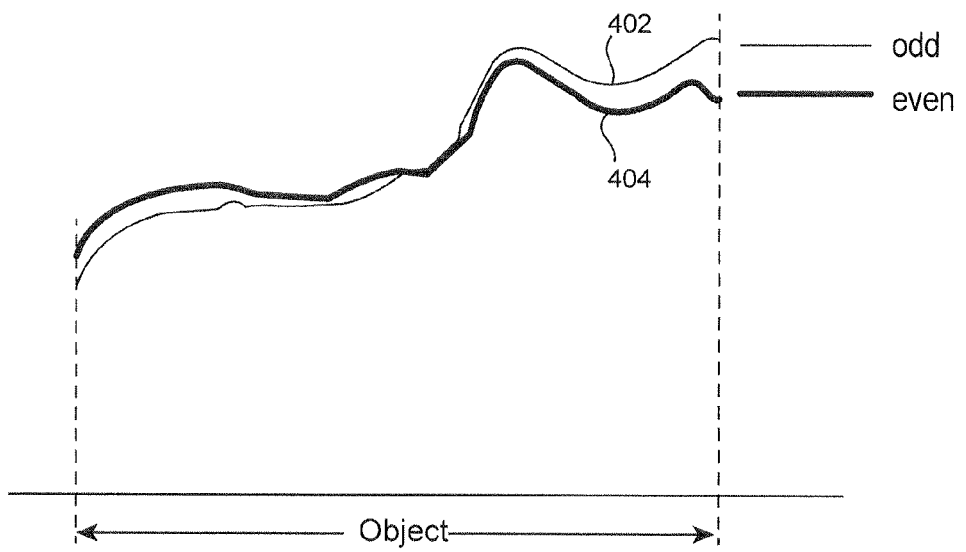
FIG. 4 is an example of changes in magnitude in two prescan images such as those shown in FIGS. 3A and 3B, in accordance with one or more embodiments.

FIG. 4 shows a sketch of a graph illustrating the difference in magnitude between the odd and even reference images in one dimension across the object, for example, along a line or narrow strip along the readout gradient direction. The graph may represent the signal received by one channel in one RF receive coil. The gap between the magnitude 402 of the odd image and the magnitude 404 of the even image at respective pixels, corresponds to the difference in magnitude between the two images. Although FIG. 4 represents the difference in one dimension, persons of skill in the art would understand that the difference may be multi dimensional with values at each pixel where a signal is received. A two-dimensional difference, for example, can be represented as a surface.

A correction map is formed using the differences in magnitude and the differences in phase in the odd and even reference images. According to an embodiment, the correction map may include a magnitude correction map containing the magnitude difference in the reference images, and a phase correction map which contains the phase differences. In other embodiments, a single correction map may include both magnitude and phase aspects as a respective complex number for each pixel. The correction map may then include the differences as a ratio of complex numbers for each pixel.

Figure 5A:
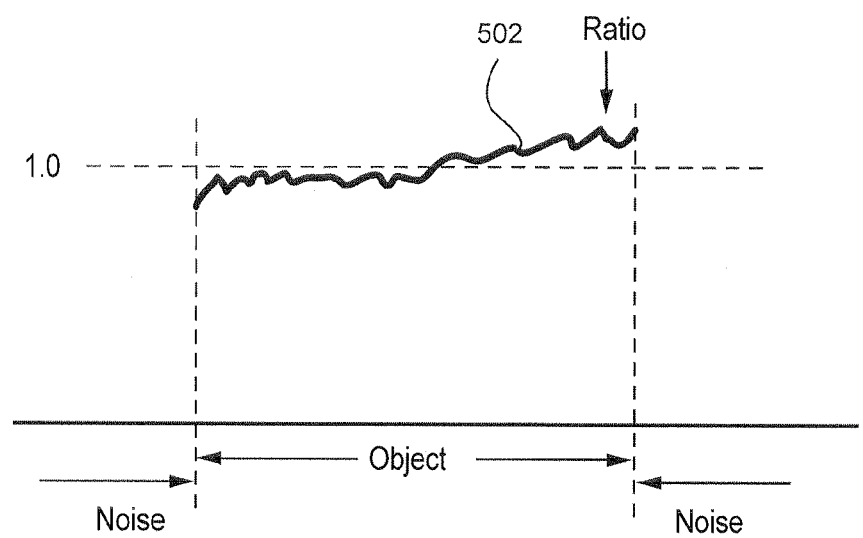
FIG. 5A is an example of changes in a magnitude difference ratio in two prescan images such as those shown in FIGS. 3A and 3B, in accordance with one or more embodiments.
Figure 5B:
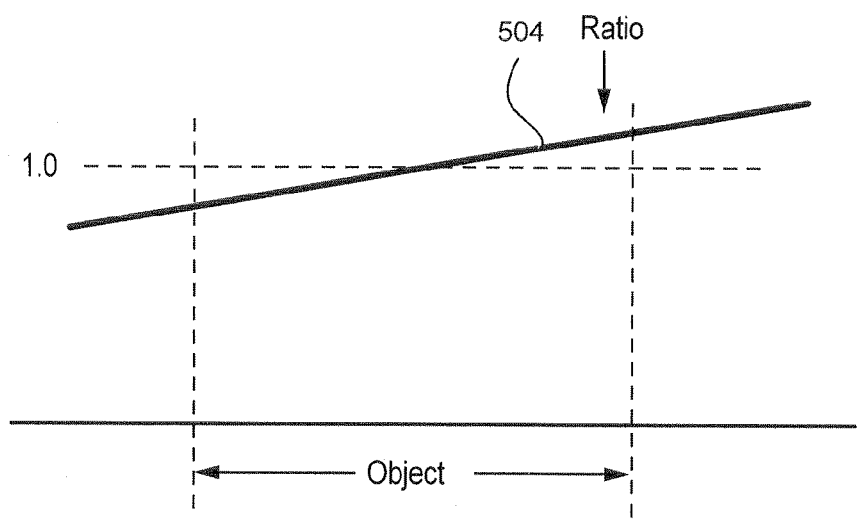
FIG. 5B is an example of a fitted function corresponding to changes in a magnitude difference ratio such as that shown in FIG. 5A, in accordance with one or more embodiments.

Optionally, the difference ratio or a part thereof is fitted to a spatial function. According to an embodiment, the magnitude difference is fitted to a 1D spatial function. An example, difference ratio 502 is shown in FIG. 5A in a 1D profile, for example, along the readout direction of a coil. FIG. 5B shows the ratio in FIG. 5A fitted to a linear function 504. The fitting may include filtering of extraneous values and determining a suitable polynomial. When a fitting function is determined, the ratio may be extrapolated to regions outside of the object's signal. In some embodiments, the difference ratios may be fitted to a non-linear polynomial.

The smoothing, such as that accomplished by fitting the difference ratio to a spatial function, may optionally be performed separately for each of respective RF receive coils or channels. Estimation of the magnitude part of the difference independently on a channel-by-channel basis may yield more accurate corrections because, for example, magnitude modulation may depend significantly on the analog coil and filter characteristics of each coil, including component tolerances, and including electromagnetic coupling to the patient and nearby coils.

In the case where each channel receives from a signal coil loop, and where each loop and channel exhibits a significant frequency dependent gain non-flatness, the even/odd relative magnitude non-flatness may be fitted with a 1D function, which is dependent upon frequency and readout direction location, but which is independent of the PE direction location, and to do so independently for each coil.

Whereas some embodiments fit the magnitude portion of the difference to a function on a channel-by-channel basis, the phase difference may be estimated on a per image basis. In effect, in some embodiments, the phase part of the difference estimation is done using all channels jointly to make one shared phase term. The shared phase term may provide better signal to noise ratio (SNR), and is justified since sources of phase error are often gradient field, eddy currents, etc., which do not depend on the receive channel.

When, as described above, the magnitude component of the difference is estimated per receive coil (or channel), the difference ratios in the correction map can be updated to comprise the phase term and the per coil magnitude term. According to an embodiment, the per coil magnitude term may be joined to a phase map. Example phase maps are described in Chen and Xu.

Returning to FIG. 2, at operation 210 the correction map is converted to have the same FOV as the diagnostic images. This conversion may require resampling or stretching of the correction map. This conversion may include selecting a central fraction of the ratio image along the PE direction, so as to maintain the primary image and to reject the Nyquist ghosts.

At operation 212, a main scan of the object that is located in the MRI gantry is performed, and MR signal information is acquired in the positive and negative gradient readout polarities. The type of main scan and the sequence of images to be acquired may be configurable. In an embodiment, for example, an EPI main scan is performed using an acquisition sequence substantially similar to the prescan sequence. The data received from this main scan may be considered to have two parts: a part acquired using the positive polarity readout gradient, and the part acquired using the negative polarity readout gradient. As discussed above in relation to the prescan, each of the positive and negative readout gradients acquires alternating lines in k-space. Also as was done in relation to the prescan image, one may refer to the set of lines which includes the line which goes through the origin of k-space (e.g., kx,ky=0,0) as even lines, and to the other set of lines as the odd lines.

At operation 214, odd/even diagnostic images are generated from the diagnostic MR data, for example, using a 2DFT.

At operation 216, one of either the even diagnostic image or the odd diagnostic image is corrected for phase and/or magnitude differences using the corresponding previously constructed correction map. According to an embodiment, the odd image is selected for correction. Each point (e.g., pixel) in the odd image is then multiplicatively corrected based upon the corresponding difference ratio from the correction map. For example, the value of pixel "a" at location x, y in the odd diagnostic image, is multiplied by the value corresponding to pixel "a" in the correction map to yield a corrected value for pixel "a" in the odd diagnostic image. This multiplicative correction may be repeated for each pixel in the odd diagnostic image. The applied correction is intended to adjust the odd image to match the even image. For example, after correction the magnitude difference between even and odd images are eliminated or significantly reduced when compared to the difference before the correction was applied. In some embodiments, however, not all pixels of the odd or even diagnostic image need be corrected using the correction map.

Another embodiment is to split the correction ratio into two equal factors, and to apply half of the correction to the odd image, and the other half of the image correction to the even image. However, splitting the phase component requires great care, because, for example, selecting the correct value from the two possible roots of a complex entity can be nontrivial. Such complexities are avoided when the full correction is applied to only one of the odd and even images, and the other is left uncorrected.

At operation 218, the corrected one of the odd or even diagnostic images is combined with the uncorrected one to yield the final diagnostic image. According to the embodiment where the odd diagnostic image is corrected, the corrected odd diagnostic image is combined with the even diagnostic image to yield the corrected final diagnostic image in which the ghost artifacts including the Nyquist ghost has been eliminated or reduced.

FIG. 6 illustrates sketches of an example even diagnostic image 602, an odd diagnostic image 604, and a final diagnostic image 608 according to conventional techniques of Nyquist ghost reduction. In even diagnostic image 602, the object 610a is overlapped by ghost components 614a and 616a. The magnitude signal, however, is evenly or substantially evenly distributed throughout at least the areas of 610a, 612a, and 614a of even diagnostic image 602. Odd diagnostic image 604, in a manner similar to even diagnostic image 602, may have object 610b and ghost components 614b and 616b. In addition, the illustrated groupings of "+" and "−" indicate the relative brightness throughout odd diagnostic image 604. In the example sketch, the distribution of "+" and "−" indicates that the odd diagnostic image 604 is too bright on the right side of the image.

Final diagnostic image 608 is an example illustration of the result when even diagnostic image 602 is combined with odd diagnostic image 604 according to conventional techniques. Although image 608 may have corrected for phase differences as done by conventional techniques, it has not been corrected for magnitude error as described in this disclosure. As a result, final diagnostic image 608 may still have ghost components 614c and 616c that are visible in addition to object 610c. Moreover, as illustrated by the "+" and "−" distribution in 608, final diagnostic image 606 is still brighter on the right side relative to its left side. The difference in brightness may be based upon the difference in brightness in odd diagnostic image 604 which remained uncorrected when the even and odd diagnostic images were combined to yield the final diagnostic image 608. Thus, as illustrated, conventional correction of phase differences do not eliminate the ghost components.

Figure 7:
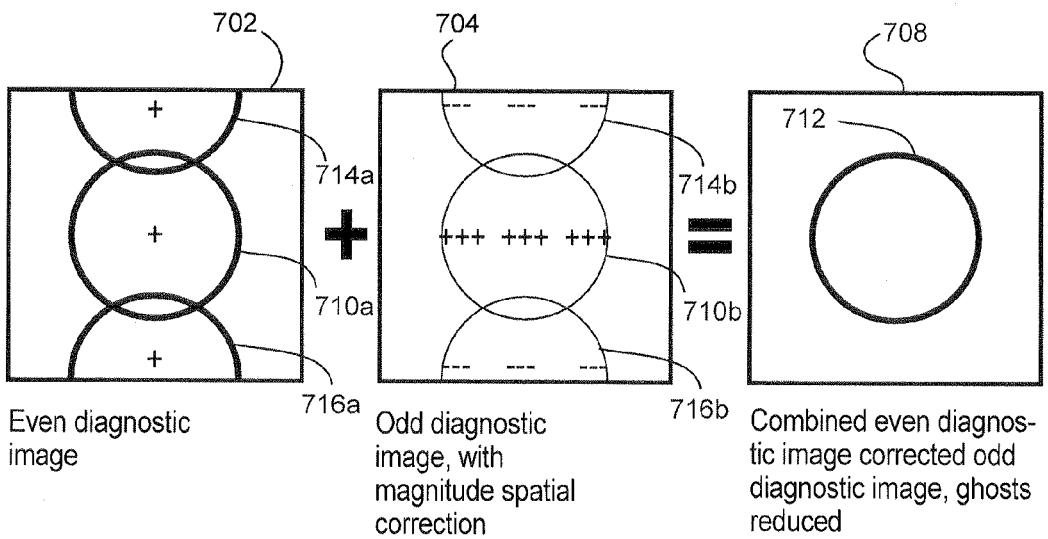
FIG. 7 illustrates example sketches of diagnostic images after reducing ghost artifacts, in accordance with some embodiments.

FIG. 7 illustrates sketches of an example even diagnostic image 702, an odd diagnostic image 704, and a final diagnostic image 708 according to some embodiments. Even diagnostic image 702 is the same as even diagnostic image 602, and represents an image generated from the same even lines as image 602. Thus, as described in relation to image 602, object 710a is overlapped by ghost components 714a and 716a, and the magnitude signal is evenly or substantially evenly distributed throughout at least the areas of 710a, 712a, and 714a. Odd diagnostic image 704, in contrast to the uncorrected image 604, has been corrected spatially for magnitude differences at least in the areas of object 710b and ghost components 714b and 716b. The illustrated groupings of "+" and "−" indicate that even diagnostic image 704 has been corrected to have equal distribution of brightness from left to right of the image at least in the areas of the 710a, 712a, and 714a. Of course, this simple description applies properly to the simple illustrative example where the underlying image should be uniform. But the same argument and results hold equally well for images such as actual anatomy with spatially dependent correct pixel values, if we adapt the description to the relative brightness between the even and odd images, as opposed to absolute brightness differences from left to right, etc.

Final diagnostic image 708 illustrates that the combination of uncorrected even diagnostic image 702, and odd diagnostic image 704 corrected spatially for magnitude differences yield a diagnostic image in which object 712 is visible but in which magnitude differences have been eliminated or have been substantially reduced when compared to image 608 in which magnitude was not spatially corrected. As described earlier in this disclosure, one or more techniques of ghost artifact removal may be applied to an image in order to eliminate or to substantially eliminate the ghost artifacts from diagnostic images. Thus, it will be understood by persons of skill in the art, that the illustration of FIG. 7 may include applying conventional techniques, such as conventional techniques in phase difference correction, to even and odd diagnostic images before and/or after combining together in order to reduce ghost artifacts. The spatial correction of magnitude differences in accordance with embodiments of this disclosure further improve the final diagnostic images by, for example, further reducing the appearance of ghost artifacts.

Applying the complex correction map can be done simple multiplication or by simple division of the even or odd image, depending upon exactly how the difference ratio is constructed, and may be an excellent approximation when the ratio does not deviate far from the value of unity. In another embodiment, the ratio map incorporating unequal magnitudes can be evaluated at each pixel and the location(s) of any aliased pixel, and used to generate an exact simultaneous inversion operation, similar to Chen's method of correcting phase maps. This simultaneous inversion from uncorrected pixels and their aliases, to corrected pixels and their aliases, is potentially more accurate when the difference between even and odd signals is greater.

As will be appreciated, the above embodiments provide MR imaging with reduced ghosting artifacts, by specifically including the magnitude term in a difference correction map and using the magnitude term to correct one of the odd or even images before the odd and even images are combined.

Among other aspects, specifically including the magnitude term in a spatially varying correction, embodiments effectively, and without a separate reconstruction, correct for frequency response non-flatness such as the magnitude variation that occurs as the receive frequency moves away from the center frequency of the receive coil.

A person of skill in the art will understand that, based upon this disclosure, the techniques disclosed herein can be extended to three dimensional (3D) acquisitions and reconstruction of MR signals, such as in EPI where there are 2 dominant readout polarities.

A person of skill in the art will understand that another extension is to acquisitions which utilize more than one segment of EPI readout. For example, the Gradient and Spin Echo (GRASE) sequence can be considered as a series of EPI readouts, each separated by an RF refocusing pulse. One approach to extending this correction to the readouts of GRASE, can be to generate a very low resolution PE prescan data set making use of an alternated gradient echo portion of the data. The subimages generated from even and odd main scan data, which, for example, are the GRASE equivalents of FIG. 6, may exhibit more complicated aliasing patterns, but the overall ability to reduce ghosts from two readout polarities remains.

Yet another extension, is to acquisitions with parallel imaging acceleration, similar to the phase correction in Xu. In parallel imaging reconstructions, it may not be required to apply multiplicative corrections directly to partially reconstructed intermediate images. Alternatively, multiplicative corrections can be incorporated indirectly, by applying them to coil sensitivity map data before the folding matrix inversion which is the basis of the SENSE algorithm. Thus, applying multiplicative magnitude factors to coil maps, as opposed to folded intermediate images, is an alternative embodiment, and may be used, for example, when magnitude correction terms have true 2D spatial dependence, because the coil maps are unaliased. Simple pixel-by-pixel multiplication can be done without regard to the parallel imaging aliasing arising from undersampling of the main acquisition data. In this extension, coil sensitivity maps are associated with even and odd data subsets, and a correction map containing both magnitude and phase information may be applied to one of the even or odd pseudocoils, but not the other.

Other advantages include that embodiments may not require new information to be acquired from the object or the scanner beyond what is already used in 2D phase correction. For example, embodiments may not require knowledge of receiver bandwidth, or off-center FOV in the readout direction. Likewise, embodiments may not require hardware or service pre-calibration (of, for example, RX channels or coil elements) beyond what is used in 2D phase correction. Also, embodiments may compensate for magnitude deviations such as a more general 2D magnitude correction that occur, for example, when a receive channel sees signal from some inductively coupled coils where each RF coil could have distinct Q etc. and resonance, so the combined coupled sensitivity of the receive channel could be a true 2D function, including aspects of the 2D RF sensitivity pattern of each coil.

Moreover, embodiments may correct for incidental slice dephasing signal loss, such as that from cross-gradient terms, Maxwell terms, or from spatially dependent eddy current terms, to the extent that they can influence signal magnitude. Additionally, by estimating in 2D, embodiments avoid many other incidental forms of signal cancelation, as might be seen in k-space peak, in 1D projections, or in combined coil data, or in DWI sensitized data with non-rigid-body motion. Estimation from the 2D data (e.g., even/odd ratios in a 2D image pair from a single acquisition, either with or without subsequent fitting to 1D) may be more robust than fitting a k-space peak, in 1D projections, or in combined coil data, or in DWI sensitized data with non-rigid-body motion.

Further advantages may include not intrinsically limiting the correction to a linear frequency dependent term. Rather, embodiments may correct for more generalized frequency function, including possibly "bumps" in analog filter or digital filter response in the RX chain. Also, by deriving the magnitude modulation from RX coil frequency non-flatness during actual imaging conditions, embodiments may avoid problems that occur where a coil is "calibrated" with one set of loading and coupling conditions, and subsequently used to "image" (e.g., main scan), with different loading, and with a different Q or different effective tuning.

It is now common to pre-combine multiple tuned hardware receiver coil loops into a single effective receiver (RX) channel. This is typically to reduce hardware costs, and to reduce the amount of data which needs to be collected, stored, and reconstructed. (e.g., fewer RX channels can lead to shorter reconstruction times.) If multiple coils are combined, especially prior to RX digitization, then applying a frequency correction to a single effective RX channel may not be optimal. The frequency correction which is best for one "loop" will not be right for another loop, when they exhibit slightly different resonant frequencies and slightly different "Q". Preventing these differences between combined loops may not be possible with practical coil design. But, because embodiments herein may allow for 2D spatially varying corrections, and because the distinct coils (before combination) have distinct positional locations, such embodiments may allow for coil correction which may be much closer to optimal, as it can provide a correction in one 2D sub-region which is more suitable for one coil loop, and it can use other correction values in other regions which are more suitable for some other coil loop, etc.

While certain embodiments have been described, these embodiments have been presented by way of example only and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging (MRI) system for effecting MR imaging with reduced ghosting artifacts, said MRI system comprising:

an MRI gantry including a static magnetic field coil, gradient magnetic field coils, at least one radio frequency (RF) coil configured to transmit RF signals into an imaging volume, and at least one RF receiver coil configured to receive nuclear magnetic resonance (NMR) RF signals from an object located in the imaging volume;

at least one digital data processing unit coupled to receive digital data from said RF receiver coil, said at least one digital data processing unit being configured to:

collect reference data for the RF receiver coil, wherein a first part of the reference data corresponds to NMR signals acquired using a first readout gradient and a second part of the reference data corresponds to NMR signals acquired using a second readout gradient which is different in polarity from the first readout gradient;

determine spatially varying signal magnitude differences associated with the first and second parts of the reference data;

generate main scan data based upon diagnostic MRI scanning of the object, wherein a first part of the main scan data corresponds to NMR signals acquired using the first readout gradient and a second part of the main scan data corresponds to NMR signals acquired using the second readout gradient; and reconstruct a diagnostic image based upon the first and second parts of the main scan data and the determined spatially varying signal magnitude differences.

2. The MRI system according to claim 1, wherein the at least one digital data processing unit is further configured to:

determine phase differences associated with the first and second parts of the reference data; and reconstruct the diagnostic image based upon the first and second parts of the main scan data, the determined phase differences, and the determined signal magnitude differences.

3. The MRI system according to claim 2, wherein the digital data processing unit is further configured to:

form a complex modulation correction map of complex numbers representing phase correction values and magnitude correction values respectively corresponding to the determined phase differences and the determined magnitude differences;

independently reconstruct a first part image based upon the first part of the main scan data and a second part image based upon the second part of the main scan data;

correct the first part image by operations including applying the phase correction values and the magnitude correction values as represented in the complex modulation correction map; and combine the corrected first part image and the second part image to form the reconstructed diagnostic image, the second part image not being corrected using the magnitude correction values.

4. The MRI system according to claim 2, wherein the determined phase differences are represented by a shared term for a plurality of channels which are configured to receive NMR signals from the object.

5. The MRI system according to claim 4, wherein the determined phase differences are represented by a shared term for a plurality of said RF receiver coils which are configured to receive NMR signals from the object.

6. The MRI system according to claim 5, wherein the shared term is based upon a two-dimensional mapping determined for the diagnostic image.

7. The MRI system according to claim 2, wherein the digital data processing unit is further configured to:

form a complex modulation correction map of complex numbers representing phase correction values and magnitude correction values respectively corresponding to the determined phase differences and the determined magnitude differences;
generating a first coil sensitivity map;
generating a complex modulation correction map from respectively the first and second reference data;
generating a second coil sensitivity map by correcting the first coil sensitivity map by operations including applying the magnitude correction values as represented in the complex modulation correction map;
independently reconstruct a first part image based upon the first part of the main scan data, and a second part image based upon the second part of the main scan data; and
combine the first part image and the second part image by operations including the first coil sensitivity map and the second sensitivity map to form the reconstructed diagnostic image.

8. The MRI system according to claim 1, wherein the determined signal magnitude differences are based upon a one dimensional spatially varying function across the diagnostic image.

9. The MRI system according to claim 1, wherein the signal magnitude differences are determined independently for each of plural RF receive coils and/or receive channels, and wherein the digital data processing unit is further configured to reconstruct the diagnostic image by performing operations comprising independently applying the determined magnitude differences to the respective RF receive coils and/or receive channels.

10. The MRI system according to claim 1, wherein the collected calibration reference data is obtained from a preparation MRI scanning (prescanning) of the object.

11. The MRI system according to claim 10, wherein the prescanning and the diagnostic scanning is performed using substantially similar scanning sequences.

12. The MRI system according to claim 10, wherein a size of one of a field of view or a gradient blip for the prescan is adjusted in order to reduce aliasing, and wherein when a field of view of spatially varying signal magnitude differences is different from a field of view of the diagnostic image, adjusting the field of view of the spatially varying signal magnitude in accordance with the field of view of the diagnostic image.

13. The MRI system according to claim 10, wherein the reference data is obtained from a single shot MRI data acquisition during the prescanning.

14. The MRI system according to claim 1, wherein the digital data processing unit further configured to:
reconstruct the diagnostic image by correcting at least one of a first or second part image using the determined spatially varying signal magnitude differences, the first part image and the second part image corresponding respectively to the first part and the second part of the main scan data.

15. The MRI system according to claim 14, wherein the digital data processing unit is further configured to:
correct the second part image using the determined spatially varying magnitude differences; and
combine the first part image and the corrected second part image to obtain the diagnostic image.

16. The MRI system according to claim 15, wherein the first part image is combined without being corrected using the determined spatially varying signal magnitude differences.

17. A method of generating magnetic resonance (MR) image having reduced ghosting artifacts, comprising:
receiving, from at least one radio frequency (RF) receiver coil, a nuclear magnetic resonance (NMR) signal from an object being subjected to imaging using a MR apparatus;
collecting reference data for the at least one RF receiver coil, wherein a first part of the reference data corresponds to NMR signals acquired using a first readout gradient and a second part of the reference data corresponds to NMR signals acquired using a second readout gradient which is different in polarity from the first readout gradient;
determining spatially varying signal magnitude differences associated with the first and second parts of the reference data;
generating main scan data based upon diagnostic MRI scanning of the object, wherein a first part of the main scan data corresponds to NMR signals acquired using the first readout gradient and a second part of the main scan data corresponds to NMR signals acquired using the second readout gradient; and
reconstructing a diagnostic image based upon the first and second parts of the main scan data and the determined spatially varying signal magnitude differences.

18. The method of claim 17, further comprising
determining phase differences associated with the first and second parts of the reference data,
wherein the reconstructing the diagnostic image includes reconstructing the diagnostic image based upon the first and second parts of the main scan data, the determined phase differences, and the determined signal magnitude differences.

19. The method of claim 18, further comprising:
forming a complex modulation correction map of complex numbers representing phase correction values and magnitude correction values respectively corresponding to the determined phase differences and the determined magnitude differences,
wherein the reconstructing the image further comprises:
independently reconstructing a first part image based upon the first part of the main scan data and a second part image based upon the second part of the main scan data;
correcting the first part image by operations including applying the phase correction values and the magnitude correction values as represented in the complex modulation correction map; and
combining the corrected first part image and the second part image to form the reconstructed diagnostic image, the second part image not being corrected using the magnitude correction values.

20. A non-transitory computer readable storage medium, having executable computer program instructions recorded thereon, which when executed by at least one processor of a magnetic resonance imaging (MRI) system having an MRI gantry including a static magnetic field coil, gradient magnetic field coils, at least one radio frequency (RF) coil configured to transmit RF signals into an imaging volume and a plurality of RF receiver coils configured to receive nuclear magnetic resonance (NMR) RF signals from an object located in the imaging volume, causes the at least one processor to generate a diagnostic image having reduced unfolding artifacts, by performing operations comprising:
collecting reference data for the at least one RF receiver coil, wherein a first part of the reference data corresponds to NMR signals acquired using a first readout gradient and a second part of the reference data corresponds to NMR signals acquired using a second readout gradient which is different in polarity from the first readout gradient;

determining spatially varying signal magnitude differences associated with the first and second parts of the reference data;

generating a main scan data based upon diagnostic MRI scanning of the object, wherein a first part of the main scan data corresponds to NMR signals acquired using the first readout gradient and a second part of the main scan data corresponds to NMR signals acquired using the second readout gradient; and reconstructing a diagnostic image based upon the first and second parts of the main scan data and the determined spatially varying signal magnitude differences.

* * * * *